United States Patent
Cipolla et al.

(10) Patent No.: US 6,592,449 B2
(45) Date of Patent: Jul. 15, 2003

(54) SMART FAN MODULES AND SYSTEM

(75) Inventors: Thomas M. Cipolla, Katonah, NY (US); Richard I. Kaufman, Somers, NY (US); Lawrence S. Mok, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/083,270

(22) Filed: Feb. 25, 2002

(65) Prior Publication Data

US 2002/0121555 A1 Sep. 5, 2002

Related U.S. Application Data (60) Provisional application No. 60/271,124, filed on Feb. 24, 2001.

(51) Int. Cl.[7] .................................................. F24F 7/00
(52) U.S. Cl. ........................ 454/184; 361/687; 312/236; 415/213; 236/49.1
(58) Field of Search ........................ 454/184; 236/49.1; 361/687, 686, 685, 688–690; 415/213; 312/236; 165/80.3, 122

(56) References Cited

U.S. PATENT DOCUMENTS

| | | | | |
|---|---|---|---|---|
| 6,392,372 B1 | * | 5/2002 | Mays, II | 318/54 |
| 6,406,257 B1 | * | 6/2002 | Houdek | 415/213.1 |
| 6,414,843 B1 | * | 7/2002 | Takeda | 361/687 |
| 2002/0121555 A1 | * | 9/2002 | Cipolla et al. | 236/49.1 |

* cited by examiner

Primary Examiner—Darren Schuberg
Assistant Examiner—Hung Van Duong
(74) Attorney, Agent, or Firm—Scully, Scott Murphy & Presser; Daniel P. Morris (57) ABSTRACT

A fan module including: two or more individual fans, each fan having an air movement means and a motor engaged with the air movement means for accelerating air entering each of the two or more individual fans; a temperature sensor for sensing a temperature associated with the two or more fans and for outputting a first signal corresponding to the temperature; rotational speed sensor for outputting a second signal corresponding to a rotational speed of each of the two or more fans; and a processor for receiving the first and second signals and controlling the two or more individual fans based on the first and second signals.

15 Claims, 7 Drawing Sheets

SMART FAN MODULES AND SYSTEM

CROSS REFERENCE TO RELATED APPLICATIONS

The present invention claims the benefit of commonly-owned, co-pending U.S. Provisional Patent Application Serial No. 60/271,124 filed Feb. 24, 2001 entitled MASSIVELY PARALLEL SUPERCOMPUTER, the whole contents and disclosure of which is expressly incorporated by reference herein as if fully set forth herein. This patent application is additionally related to the following commonly-owned, co-pending United States Patent Applications filed on even date herewith, the entire contents and disclosure of each of which is expressly incorporated by reference herein as if fully set forth herein. PCT patent application US02\05618, for "Class Networking Routing"; PCT patent application US02\05586, for "A Global Tree Network for Computing Structures"; PCT patent application US02\05567, for 'Global Interrupt and Barrier Networks"; PCT patent application US02\05569, for 'Optimized Scalable Network Switch"; PCT patent application US02\05618, for "Arithmetic Functions in Torus and Tree Networks'; PCT patent application US02\05568, for 'Data Capture Technique for High Speed Signaling"; PCT patent application US02\05587, for 'Managing Coherence Via Put/Get Windows'; PCT patent application US02\05575, for "Low Latency Memory Access And Synchronization"; PCT patent application US02\05614, for 'Twin-Tailed Fail-Over for Fileservers Maintaining Full Performance in the Presence of Failure"; PCT patent application US02\05572, for "Fault Isolation Through No-Overhead Link Level Checksums'; PCT patent application US02\05570, for "Ethernet Addressing Via Physical Location for Massively Parallel Systems"; PCT patent application US02\05566, for "Fault Tolerance in a Supercomputer Through Dynamic Repartitioning"; U.S. patent application Ser. No. 10/258,515, for "Checkpointing Filesystem"; PCT patent application US02\05574, for "Efficient Implementation of Multidimensional Fast Fourier Transform on a Distributed-Memory Parallel Multi-Node Computer"; and PCT patent application US02\05571, for "A Novel Massively Parallel Supercomputer.

BACKGROUND OF THE INVENTION

1. Field of the Invention

The present invention relates generally to fan modules, and more particularly, to fan modules used for cooling of heat generating computer components.

2. Prior Art

Groups of individual fans are often grouped into modules containing several fans. These modules may even be combined to form an array of fans, which can be used for cooling computer rack systems. Fan modules currently available do not have the capability of sensing, monitoring, and controlling the status of the individual fans in the module because they do not have the necessary intelligence built into the module. Therefore, it is difficult to set the fan speed of each individual fan in the module and to monitor each of the individual fans in the module locally and/or remotely.

SUMMARY OF THE INVENTION

Therefore it is an object of the present invention to provide a fan module which overcomes the disadvantages associated with the prior art.

Accordingly, a fan module is provided. The fan module comprises: two or more individual fans, each fan having an air movement means and a motor engaged with the air movement means for accelerating air entering each of the two or more individual fans; a temperature sensor for sensing a temperature associated with the two or more fans and for outputting a first signal corresponding to the temperature; rotational speed means for outputting a second signal corresponding to a rotational speed of each of the two or more fans; and a processor for receiving the first and second signals and controlling the two or more individual fans based on the first and second signals.

Preferably, the temperature sensor is selected from a group consisting of a thermistor and thermocouple. Preferably, the rotational speed means comprises an RPM signal output from each of the two or more individual fans, the RPM signal comprising the second signal.

Each processor preferably controls each corresponding fan by varying a pulse width of a supply voltage supplied to each of the two or more individual fans.

The fan module preferably farther comprises a bracket for housing each of the two or more fans, means for damping vibration from each of the two or more fans and/or a nonvolatile memory connected to each processor for storing a control program for instructing each processor.

Also provided is an array of fans, each fan having an air movement means and a motor engaged with the air movement means for accelerating air entering each fan. The array of fans comprising: two or more fan modules, each fan module having two or more individual fans, a temperature sensor for sensing a temperature associated with the two or more fans and for outputting a first signal corresponding to the temperature, rotational speed means for outputting a second signal corresponding to a rotational speed of each of the two or more fans, and a processor for receiving the first and second signals and controlling the two or more individual fans based on the first and second signals; and a fan frame for housing the at least two or more fan modules.

The array of fans preferably further comprises a bracket corresponding to each of the two or more fan modules, each bracket housing the two or more fans therein and further having a means for securing to the frame; a host controller for interacting with each of the processors of each of the two or more modules; and/or an electrical connector on each bracket and a mating electrical connector on the frame for electrically connecting each of the processors to the host controller. Preferably, each electrical connector has location identification pins hard wired therein for determining the physical location of the fan module in the frame.

The array of fans preferably further comprises at least one indicator operatively connected to the host controller and disposed on a side of the bracket for displaying the status of the fan module. The at least one indicator preferably comprises two LED indicators, one of which is a first color and the second of which is a second color different from the first color.

The array of fans preferably further comprises a data link operatively connected to the host controller for communicating with a remote location.

Still yet provided is a computer comprising: heat generating elements; and an array of cooling fans for cooling at least one of the heat generating elements, each cooling fan having an air movement means and a motor engaged with the air movement means for accelerating air entering each cooling fan, the array of cooling fans comprising, two or more fan modules, each fan module having two or more individual cooling fans, a temperature sensor for sensing a temperature associated with the cooling fans and for outputting a first signal corresponding to the temperature, rotational speed means for outputting a second signal corresponding to a rotational speed of each of the cooling fans, a processor for receiving the first and second signals and controlling the individual cooling fans based on the first and second signals, and a fan frame for housing the at least two or more fan modules.

The computer preferably further comprises a bracket corresponding to each of the two or more fan modules, each bracket housing the two or more cooling fans therein and further having a means for securing to the frame; a host controller for interacting with each of the processors of each of the two or more modules; and/or an electrical connector on each bracket and a mating electrical connector on the frame for electrically connecting each of the processors to the host controller. Preferably, each electrical connector has location identification pins hard wired therein for determining the physical location of the fan module in the frame.

The computer preferably further comprises at least one indicator operatively connected to the host controller and disposed on a side of the bracket for displaying the status of the fan module. The at least one indicator preferably comprises two LED indicators, one of which is a first color and the second of which is a second color different from the first color.

The computer preferably further comprises a data link operatively connected to the host controller for communicating with a remote location.

BRIEF DESCRIPTION OF THE DRAWINGS

These and other features, aspects, and advantages of the apparatus of the present invention will become better understood with regard to the following description, appended claims, and accompanying drawings where:

DETAILED DESCRIPTION OF THE PREFERRED EMBODIMENT

Although this invention is applicable to numerous and various types of fan modules, it has been found particularly useful in the environment of cooling systems for computers. Therefore, without limiting the applicability of the invention to cooling systems for computers, the invention will be described in such environment. Such a computer system is described in co-pending PCT Patent Applications, US02\05618; US02\05568; US02\05587; US02\05575; US02\05574; US02\05573; US02\05586; US02\05567; US02\05569; US02\05566; US02\05571; US02\05614; US02\05572; US02\05570; and U.S. patent application Ser. No. 10/258,515; the entire disclosures of which are incorporated herein by their reference.

Figure 1:
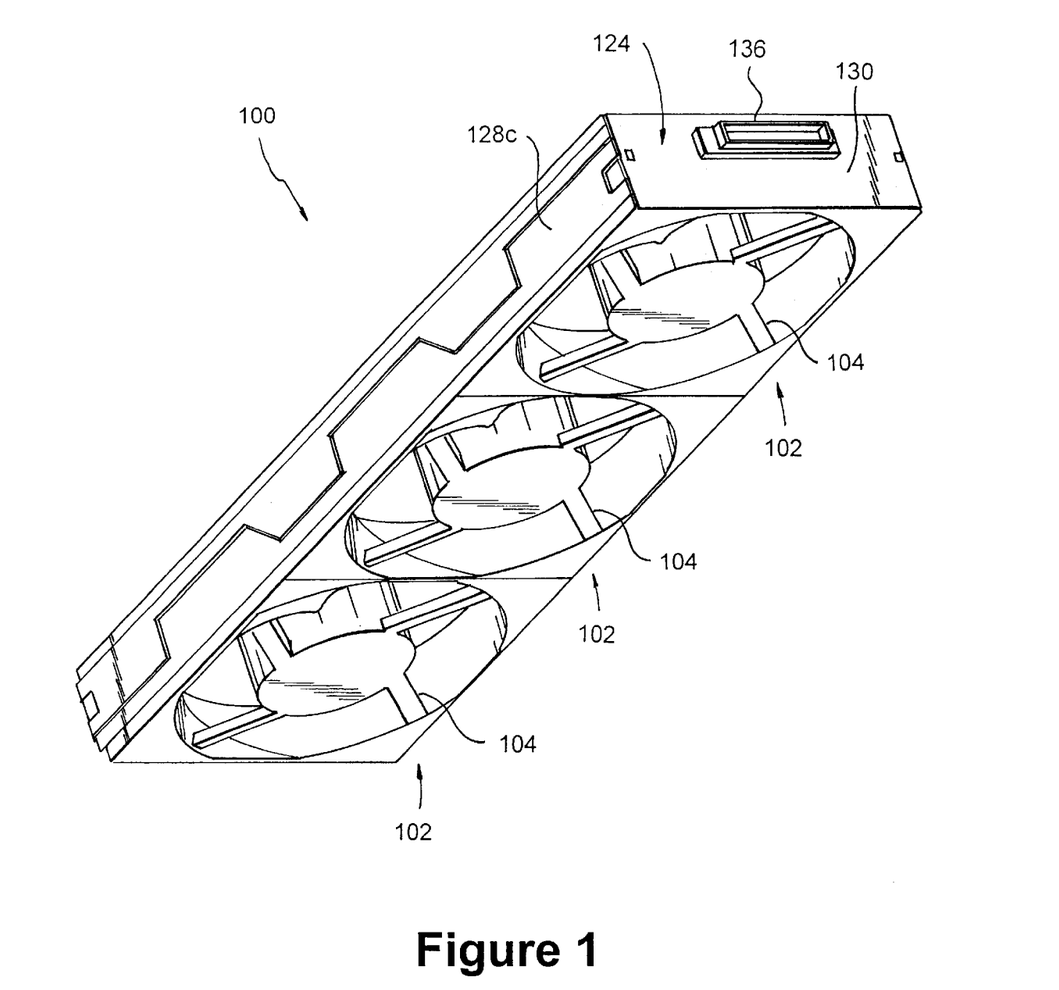
FIG. 1 illustrates an isometric view of a preferred implementation of a fan module of the present invention.
Figure 2:
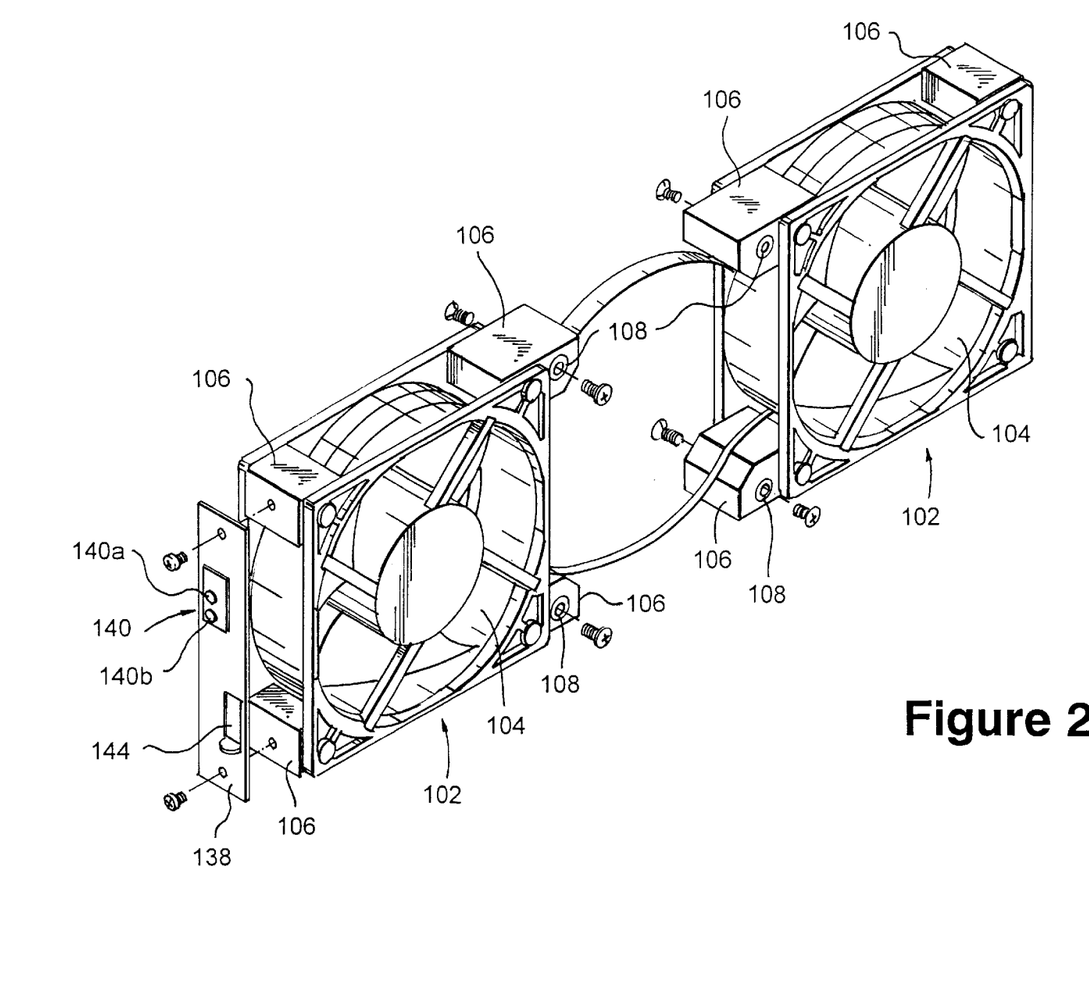
FIG. 2 illustrates an exploded isometric view of two individual fans from the module of FIG. 1.

Referring now to FIG. 1, a preferred implementation of a fan module is illustrated therein, the fan module being generally referred to by reference numeral 100. The fan module comprises two or more individual fans 102. The fan module 100 of FIG. 1 is shown by way of example having three such individual fans 102, however, the module 100 can have any number of fans greater than one without departing from the scope or spirit of the present invention. Each fan 102 has an air movement means, such as a fan blade 104 or a squirrel cage (not shown). A motor (shown schematically in FIG. 4 as reference numeral 103) engages with the air movement means for accelerating air entering each of the fans 102. Although numerous and various types of fans are contemplated by the present invention, pancake type fans are preferred, particularly if the modules 100 are used for cooling computers and computer equipment. Referring now to FIG. 2, each fan 102 includes a means for vibration and noise dampening, such as rubber motor mounts 106. The rubber motor mounts 106 are preferably disposed at each of four corners of each fan 102. Each motor mount 106 preferably includes a threaded insert 108 or other means for fastening the fan 102 to a bracket (discussed below).

Figure 4:
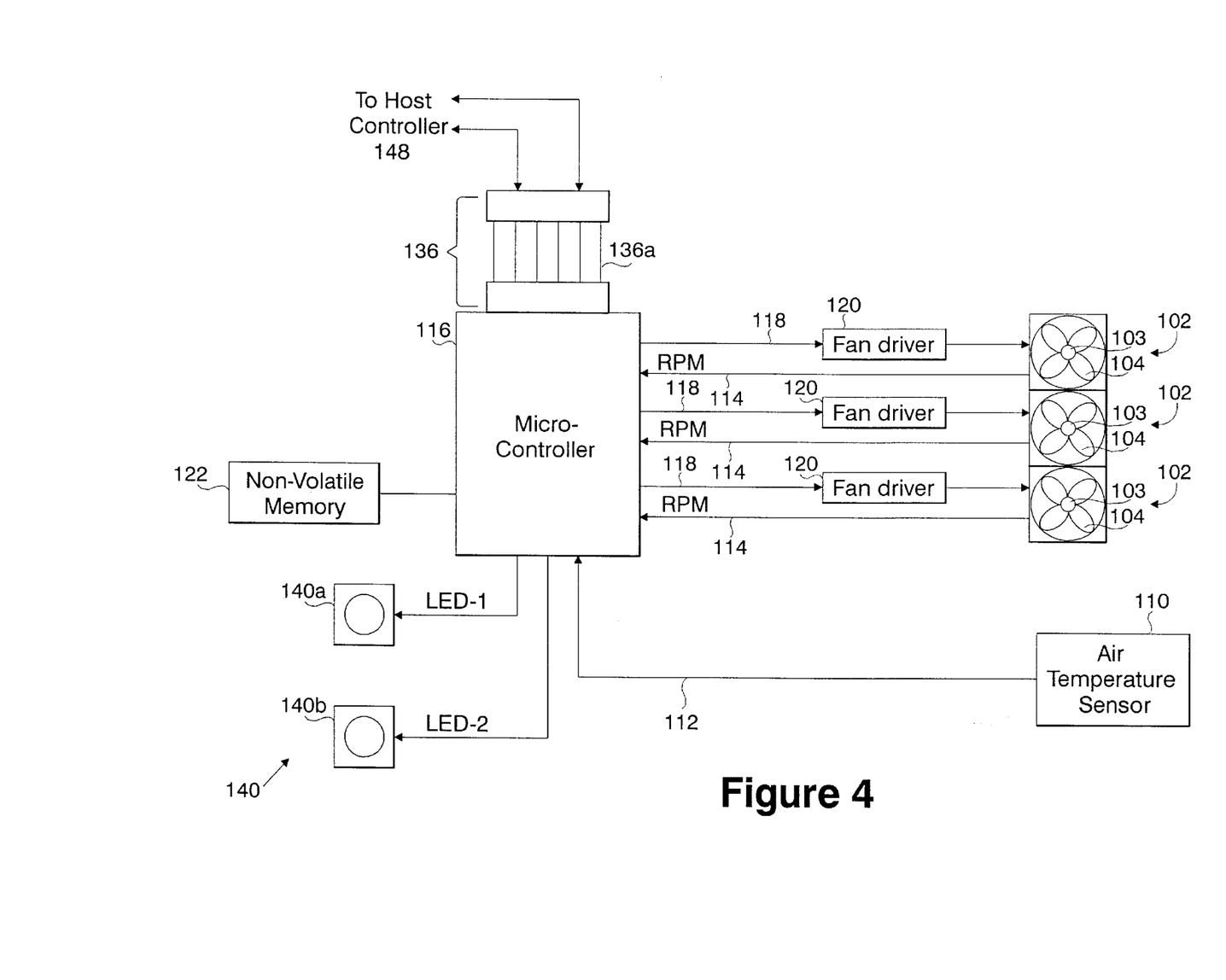
FIG. 4 illustrates an electrical schematic of a fan module according to a preferred implementation of the present invention.

Referring now to FIG. 4, the fan module 100 includes a temperature sensor 110 for sensing a temperature associated with the fans 102 and outputs a first signal 102 corresponding to the temperature. Preferably, the temperature sensor 110 is a thermistor or thermocouple and senses an air temperature across the fans 102. Although a temperature sensor 110 can be provided for each of the fans 102 in the fan module 100, it is preferred that a single temperature sensor 110 is provided as illustrated in FIG. 4. Alternatively, the temperature associated with the fans 102 can be the heat of the windings of one or each of the fans 102 in the fan module 100. In such an instance, the temperature of the windings would directly relate to the amount of airflow across the fan 102 since the airflow across the fan is generally used to also cool the fan's windings. Properly placed thermistors or thermocouples are preferably used to detect the temperature of the fan's windings.

A means is also provided for outputting a second signal 114, which corresponds to a rotational speed of each of the individual fans 102 of the fan module 100. Preferably, each individual fan has an output signal 114, which is indicative of the RPM speed of the fan 102. Therefore, no additional fan speed sensor is necessary. However, if such an output signal is not available from the fan 102, a sensor (not shown), such as optical sensors well known in the art can be used to detect the rotational speed of the fan blade 104 and output the corresponding signal 114.

The module 100 further includes a processor 116 (alternatively referred to as a microcontroller) corresponding to each of the individual fans 102 of the fan module 100. The processor 116 receives the first and second signals 112, 114 and controls a corresponding fan 102 based on the first and second signals 112, 114. Preferably, the processor 116 is programmed to provide a pulse width modulated (PWM) signal 118 to each of the fans 102 through a corresponding fan driver 120. The rotational speed of each fan 102 is preferably adjusted by changing the pulse width of the supply voltage to the motor 103 of each fan 102. Those skilled in the art will realize that other schemes are possible for varying the rotational speed of the fans 102, such as by simply varying the supply voltage to the fans 102.

Preferably, the processor 116 controls the speed of each fan 102 when the temperature detected falls below a predetermined temperature set point. However, the processor 116 can also control the fans 102 based upon a predetermined relationship between the fan speed and temperature. That is, each detected temperature or range of detected temperatures corresponds with a certain fan speed. A non-volatile memory 122 is provided and connected to the processor 116 for storing a control program for controlling the fans 102 according to the control scheme utilized. The non-volatile memory 122 also preferably stores data such as rotational speeds of the fans and temperature set points.

Figure 3:
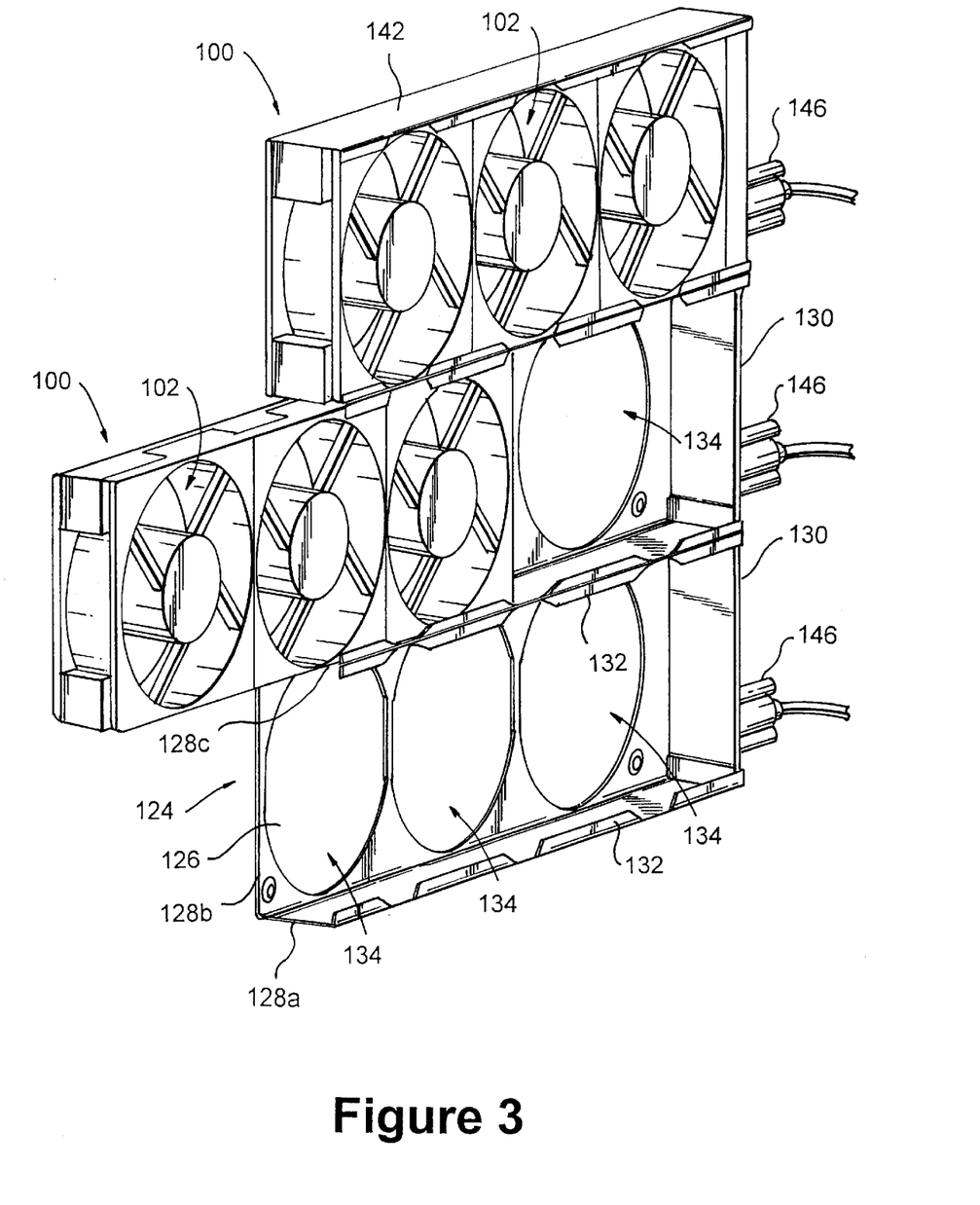
FIG. 3 illustrates an isometric view of an array of fans in which some of the individual fans are removed to show details of the fan brackets and frame.

Referring back to FIG. 1, the fan module 100 preferably further includes a bracket 124 for housing each of the individual fans 102. The bracket 124 is also shown in FIG. 3 having no fans disposed therein for clarity. The bracket 124 preferably has a channel 126 defined by at least three walls 128$a$, 128$b$, and 128$c$ and an end face 130. The channel 126 is sized to accept the fans 124 at its open end. Walls 128$a$ and 128$c$ further have lips 132 to retain the fans 102 in the channel 126. Holes 134 are provide in wall 128$b$ to provide an opening for airflow into or out of each fan 102. Wiring for each fan's 102 power supply, rotational speed signal, and for the air temperature sensor are routed inside the bracket 124 and preferably connected to an electrical connector 136 disposed on the end face 130. Preferably, the electrical connector 136 is a male pinned connector as is illustrated in FIG. 1, however, the electrical connector 136 can be any number of types including a thin film type which would enable very narrow gaps among a plurality of fan modules arranged in a frame, as discussed below. After assembly of the fans 102 into the bracket 124, an end plate 138 (shown in FIG. 2) is secured to the last fan 124 placed into the bracket 124.

The module 100 can also be provided with at least one indicator operatively connected to the processor 116 and disposed on a side of the bracket 124, preferably on the end plate 138, for displaying the status of the fan module 100. Preferably, the at least one indicator comprises two LED indicators 140, one of which is a first color, such as green, and the second of which is a second color different from the first color, preferably red. The processor 116 sends signals to the LED's 140 to display the status of the module 100. For example, the red LED 140$a$ can indicate the fan module 100 is not performing as intended while the green LED 140$b$ may indicate that all is well with the module 100. The LED's 140 may also be used to identify a particular fan 102 in the module 100 which is not performing as intended. For instance, the red LED 140$a$ can blink once for the first fan 124 in the module 100, twice for the second fan 102 in the module, and so on. Alternatively, although not preferred, an LED pair 140 may be provided for each fan 102 in the module 100.

Figure 6:
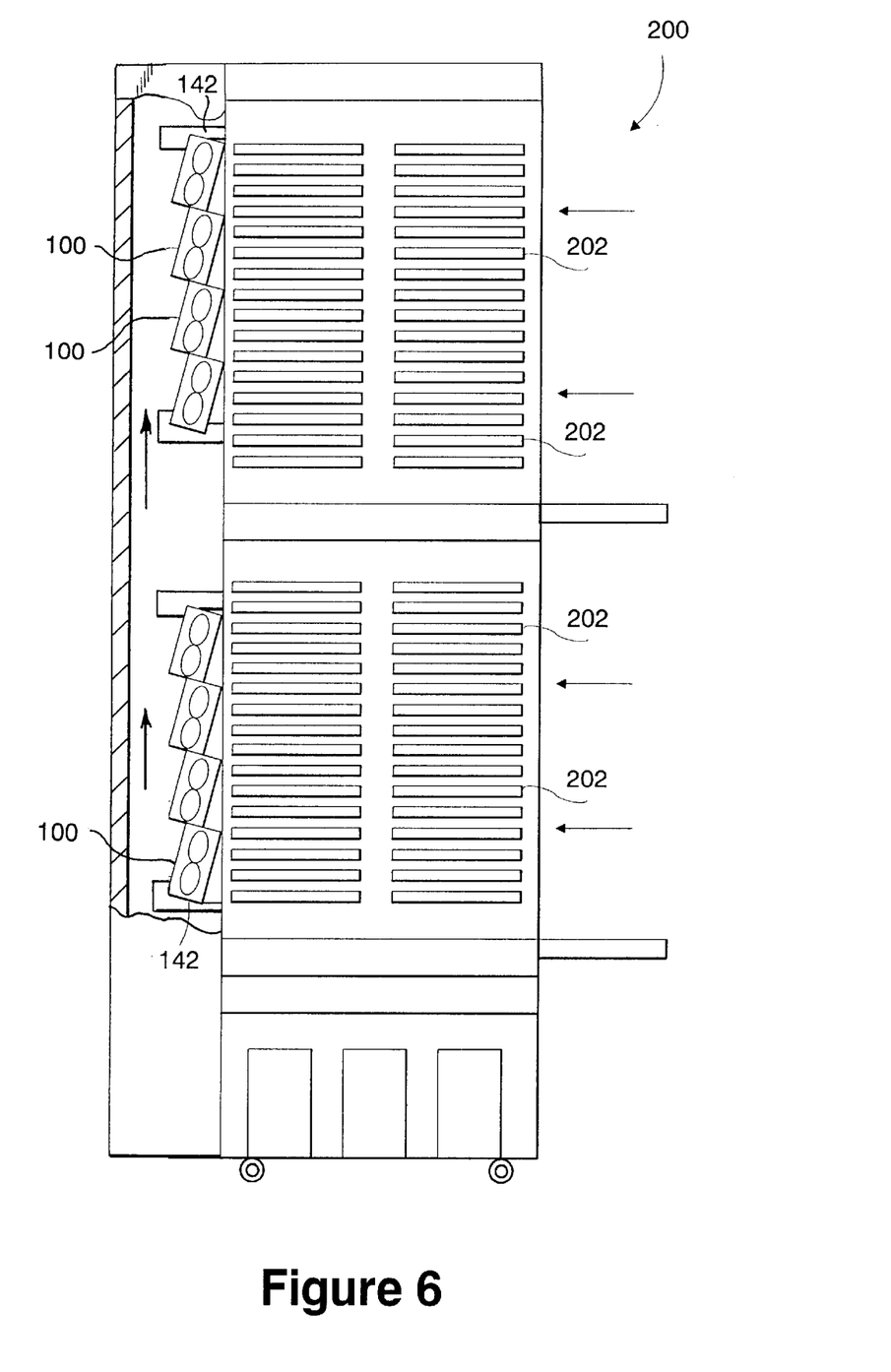
FIG. 6 illustrates a side view of a computer rack system having heat generating elements and an array of fans according to a preferred implementation of the present invention.

Referring now to FIG. 3, there is shown an array of fans 102 comprised of three modules 100. Those skilled in the art will realize that three modules are shown by way of example only and not to limit the scope or spirit of the present invention. Those skilled in the art will realize that an array of fans can be formed with a minimum of two modules 100 each having a minimum of two fans 102. The individual brackets 124 can be mounted to a common frame 142 or each bracket 124 can have a means (not shown) for attaching to another bracket 124. At least one latch 144 is preferably provided on each bracket 124, preferably two latches 144 are provided on each fan module 100, one disposed on the end plate 138 and another disposed on the end face 130 for securing the bracket 124 to the frame 142. Each latch 144 operates a mechanism (not shown) for securing the bracket 124 to the frame 142 and to provide quick and easy insertion and removal of the module 100 in and out of the frame 142. Such mechanisms are well known in the art. Although the brackets 124 are shown arranged in the same plane, they can also be offset from each other by a predetermined angle, as is shown in FIG. 6. Furthermore, they can also be offset from each other in a linear horizontal and/or vertical direction (not shown).

When each module 100 is secured to the frame 142, its electrical connector 136 is inserted or connected into a mating electrical connector 146 on the frame 142. The mating electrical connector 146 is shown as a cabled connector, but may also be hard wired into the frame 142. In such a configuration, the connector 136 and the electronics in the module 100 will provide the module 100 to be hot swappable.

Figure 5:
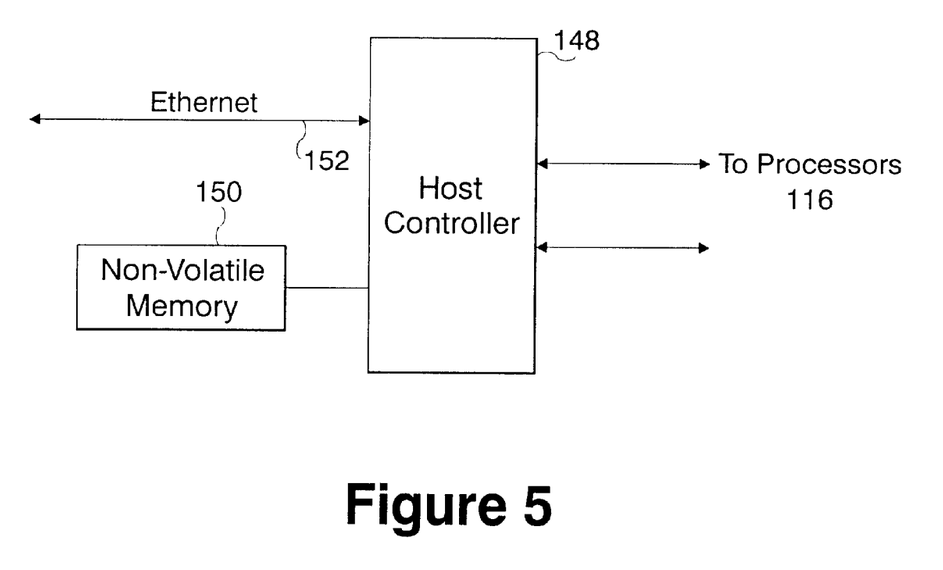
FIG. 5 illustrates an electrical schematic of a host controller for interfacing with the fan module of FIG. 4.

Referring now to FIGS. 4 and 5, the electrical connector 136 on the bracket 142 and mating electrical connector 146 on the frame 142 preferably electrically connect each of the processors 116 to a host controller 148. The host controller 148 receives communications from the processors 116 and acts as a relay station interacting with all of the processors 116 in the modules 100. The host controller 148 can also send data to the processors 116, such as set points for rotational speed, air temperature, supply voltage etc. as well as to update the control program, all of which are preferably stored in a non-volatile memory 150 connected to the host controller 148. Preferably, the connector 136 has location identification pins 136$a$ hard wired such that when the fan module 100 is inserted in to its mating connector 146 on the frame 142, the processor 116 corresponding to the fan module 100 can determine the physical location of the fan module 100 in the frame 142 and transmit a corresponding signal to the host controller 148.

A data link 152, such as an Ethernet link, is also provided and is operatively connected to the host controller 148 for communicating with a remote location, such as a control and monitoring station (not shown).

Referring now to FIG. 6, there is shown a computer generally referred to by reference numeral 200. The computer 200 has heat-generating elements, such as processors 202. Although the computer shown has numerous processors and heat generating elements 202 arranged on a rack, the invention is not limited thereto. Those skilled in the art will realize that a computer having a single heat-generating element, such as a processor will benefit from the fan modules 100 of the present invention.

As illustrated in FIG. 6, the frame 142 has a plurality of fan modules 100 which are used to cool the heat generating elements 202 by forced convection by drawing air into one side of the rack by the array of fans 102 mounted on the opposite side of the rack. Thus, cool air flows past the heat generating elements 202 to cool the same. The fans 102 in the array can be a single array or packaged into groups of arrays as shown. Since the modules 100 are preferably configured to be hot swappable, as discussed above, they can be replaced without affecting the operation of the computer. All or any combination of the module and array features discussed above can also be utilized in the computer 200.

Figure 7:
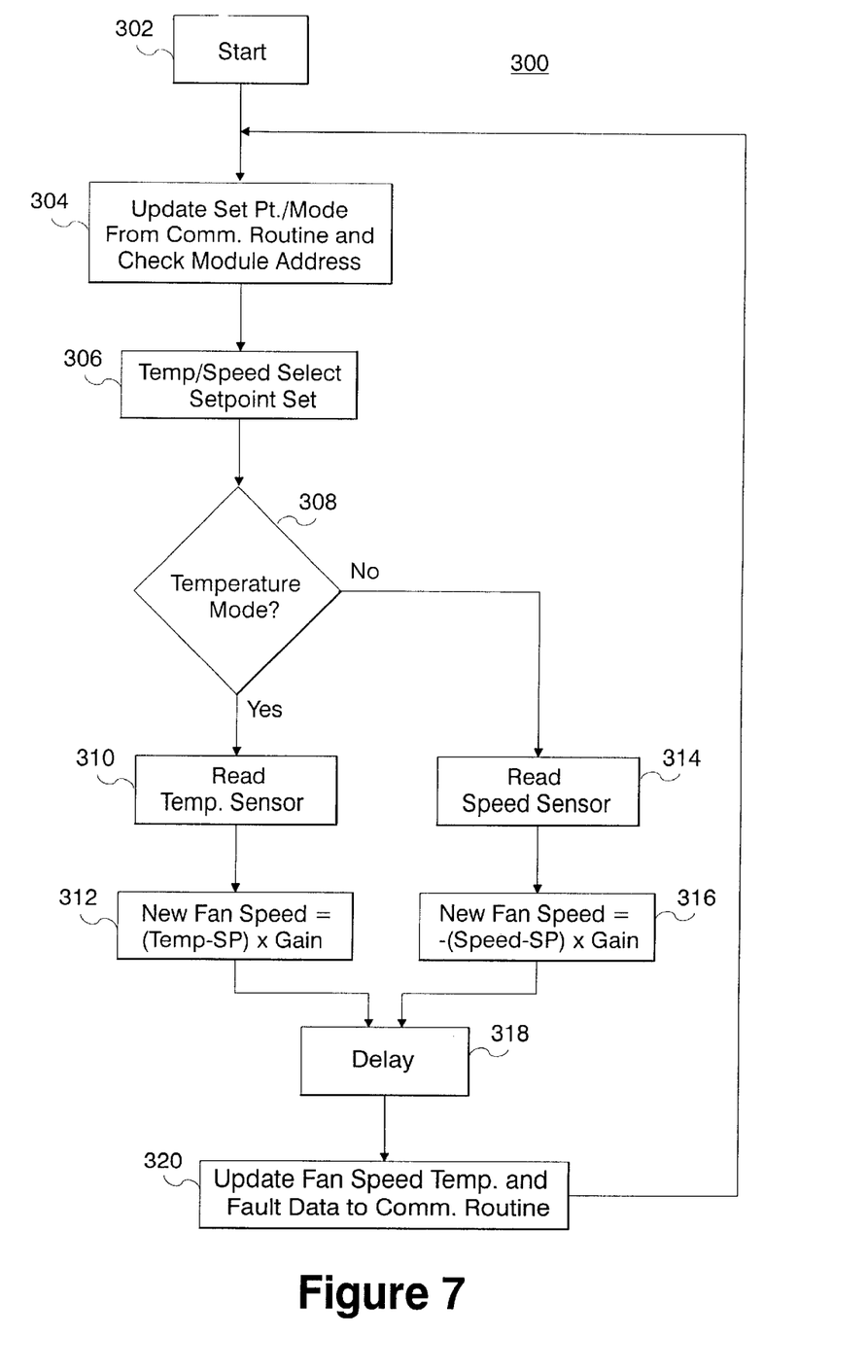
FIG. 7 illustrates a flow chart of a preferred control process for the fan modules of the present invention.

Referring now to FIG. 7, a flowchart illustrating a preferred control process for the fan module 100 is shown, the process being generally referred to by reference numeral 300. A control program corresponding to the control process 700 is preferably stored in the nonvolatile memory 122. At power up or when the fan module 100 is plugged into the frame 142, illustrated as step 302, the fan module address pins 136$a$ which are preferably hard wired in the frame 142 are read and a communication program which is used to make communications between the fan modules 100 and the host controller 148 is made at step 304. The control program then reads out the temperature and speed set points of each fan 102 in the module 100 at step 306. If temperature setting mode is necessary (illustrated as decision 308—Yes), the temperature will be read from the temperature sensor 110 at step 310 and the fan speed is adjusted accordingly at step 312. If fan speed setting is necessary (illustrated as decision 308—No), the fan rotational speed is read at step 314 and the fan speed is adjusted accordingly at step 316. After a preset time of delay, shown at step 318, the new fan speed and air temperature will preferably be reported to the host controller 148 through the established communication link at step 320. The process 300 will then loop back to step 304 for continued monitoring and adjustment, if necessary, of the air temperature and fan speed, until the process is terminated.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be construed to cover all modifications that may fall within the scope of the appended claims.

What is claimed is:

1. A fan module comprising:
   two or more individual fans, each fan having an air movement means and a motor engaged with the air movement means for accelerating air entering each of the two or more individual fans;
   a temperature sensor for sensing a temperature associated with the two or more fans and for outputting a first signal corresponding to the temperature;
   rotational speed means for outputting a second signal corresponding to a rotational speed of each of the two or more fans; and
   a processor for receiving the first and second signals and controlling the two or more individual fans based on the first and second signals.

2. The fan module of claim 1, wherein the temperature sensor is selected from a group consisting of a thermistor and thermocouple.

3. The fan module of claim 1, wherein the rotational speed means comprises an RPM signal output from each of the two or more individual fans, the RPM signal comprising the second signal.

4. The fan module of claim 1, wherein each processor controls each corresponding fan by varying a pulse width of a supply voltage supplied to each of the two or more individual fans.

5. The fan module of claim 1, further comprising a bracket for housing each of the two or more fans.

6. The fan module of claim 1, further comprising means for damping vibration from each of the two or more fans.

7. The fan module of claim 1, further comprising a nonvolatile memory connected to each processor for storing a control program for instructing each processor.

8. An array of fans, each fan having an air movement means and a motor engaged with the air movement means for accelerating air entering each fan, the array of fans comprising:
   two or more fan modules, each fan module having two or more individual fans, a temperature sensor for sensing a temperature associated with the two or more fans and for outputting a first signal corresponding to the temperature, rotational speed means for outputting a second signal corresponding to a rotational speed of each of the two or more fans, and a processor for receiving the first and second signals and controlling the two or more individual fans based on the first and second signals; and
   a fan frame for housing the at least two or more fan modules.

9. The array of fans of claim 8, further comprising a bracket corresponding to each of the two or more fan modules, each bracket housing the two or more fans therein and further having a means for securing to the frame.

10. The array of fans of claim 9, further comprising a host controller for interacting with each of the processors of each of the two or more modules.

11. The array of fans of claim 10, further comprising an electrical connector on each bracket and a mating electrical connector on the frame for electrically connecting each of the processors to the host controller.

12. The array of fans of claim 10, further comprising at least one indicator operatively connected to the host controller and disposed on a side of the bracket for displaying the status of the fan module.

13. The array of fans of claim 10, further comprising a data link operatively connected to the host controller for communicating with a remote location.

14. The array of fans of claim 11, where each electrical connector has location identification pins hard wired therein for determining the physical location of the fan module in the frame.

15. The array of fans of claim 12, wherein the at least one indicator comprises two LED indicators, one of which is a first color and the second of which is a second color different from the first color.

* * * * *